(12) United States Patent
Choy et al.

(10) Patent No.: US 8,823,445 B2
(45) Date of Patent: Sep. 2, 2014

(54) SYSTEMS AND METHODS FOR CONTROLLING POWER IN SEMICONDUCTOR CIRCUITS

(71) Applicants: Jon S. Choy, Austin, TX (US); Kerry A. Ilgenstein, Austin, TX (US)

(72) Inventors: Jon S. Choy, Austin, TX (US); Kerry A. Ilgenstein, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/689,043

(22) Filed: Nov. 29, 2012

(65) Prior Publication Data

US 2014/0145699 A1 May 29, 2014

(51) Int. Cl.
*G05F 1/10* (2006.01)
*G05F 3/02* (2006.01)

(52) U.S. Cl.
USPC ........................................................ 327/541

(58) Field of Classification Search
USPC ................. 327/538, 540, 541, 205, 206
See application file for complete search history.

(56) References Cited

U.S. PATENT DOCUMENTS

| 5,361,000 | A  | * | 11/1994 | Koshikawa et al. | ......... 327/530 |
| 7,142,019 | B2 |   | 11/2006 | Mair et al. | |
| 7,439,798 | B2 | * | 10/2008 | Kouno et al. | ................ 327/541 |
| 7,570,100 | B2 |   | 8/2009  | Dong et al. | |
| 7,961,027 | B1 | * | 6/2011  | Chen et al. | ................... 327/291 |
| 8,015,419 | B2 |   | 9/2011  | Rowhani et al. | |
| 2003/0102904 | A1 |   | 6/2003 | Mizuno et al. | |
| 2008/0272809 | A1 |   | 11/2008 | Idgunji et al. | |
| 2009/0115258 | A1 |   | 5/2009 | Flynn et al. | |
| 2010/0085088 | A1 | * | 4/2010 | Jinbo | ............................ 327/143 |

OTHER PUBLICATIONS

EP Search Report correlating to 13193886 dated Feb. 26, 2014.

* cited by examiner

*Primary Examiner* — Quan Tra
(74) *Attorney, Agent, or Firm* — Mary Jo Bertani; Joanna G. Chiu

(57) ABSTRACT

A power control circuit includes a plurality of transistors coupled between a power supply node and a gated power supply node, wherein the gate electrode of a first transistor of the plurality of transistors is coupled to receive a power control signal, wherein, in response to assertion of the power control signal, the first transistor is placed into a conductive state; a first voltage comparator, wherein, in response to assertion of the power control signal, places a second transistor of the plurality of transistors in a conductive state when a voltage on the gated voltage supply node reaches a first reference voltage; and a second voltage comparator, wherein, in response to assertion of the power control signal, places a third transistor of the plurality of transistors in a conductive state when the voltage on the gated voltage supply node reaches a second reference voltage different from the first reference voltage.

19 Claims, 2 Drawing Sheets

SYSTEMS AND METHODS FOR CONTROLLING POWER IN SEMICONDUCTOR CIRCUITS

BACKGROUND OF THE DISCLOSURE

1. Field of the Disclosure

The present disclosure relates in general to semiconductor devices, and more specifically to systems and methods for controlling power in semiconductor circuits.

2. Description of the Related Art

In some situations, it is desirable to switch from a full power or low power mode to an ultra low power mode when operating an electronic device. As the size of transistors and other components used in the devices are continually being made smaller, the voltages used to operate the devices is also decreasing. Yet the number of devices is simultaneously increasing, so a greater load is placed on the voltage supply that drives the devices. When power modes are changed, the effects of voltage and current transients may be pronounced and sufficient to lower a supply voltage to the extent of causing a power on reset.

It is therefore desirable to minimize transients in supply voltage in electronic circuits.

BRIEF DESCRIPTION OF THE DRAWINGS

The benefits, features, and advantages of the present disclosure will become better understood with regard to the following description, and accompanying drawings where.

DETAILED DESCRIPTION

The following description is presented to enable one of ordinary skill in the art to make and use the present disclosure as provided within the context of a particular application and its requirements. Various modifications to the preferred embodiment will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Embodiments of systems and method disclosed herein help prevent transients in supply voltage when switching power modes in an electronic device. The supply voltage is regulated by a series of switches or gates that turn on in succession, gradually increasing the voltage provided to external circuits. The switches are triggered on voltages in circuitry coupled to the switches reaching successively higher values. Thus, the supply voltage is regulated on voltage rather than being based solely on time. The current supplied to external circuitry is kept at a more constant level, thus avoiding stress on the external circuitry during power mode changes due to excessive transients in current and/or voltage.

Figure 1:
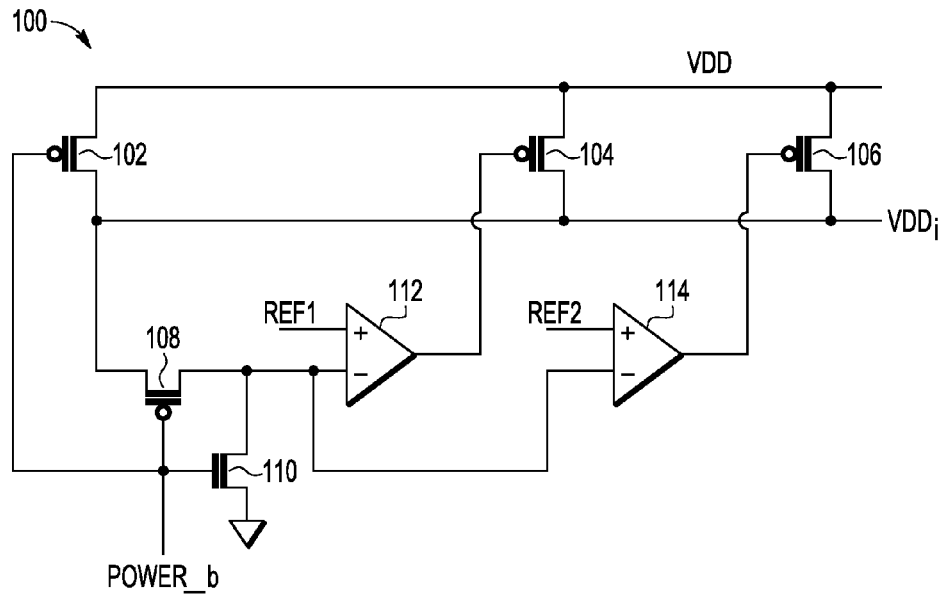
FIG. 1 is a block diagram of an embodiment of a system for controlling power in a semiconductor device.

FIG. 1 is a block diagram of an embodiment of a system 100 for controlling power in a semiconductor device such as flash memory, a processor, or other electronic circuit that requires a supply power and are capable of operating in two or more modes. The operating modes may include power on and power off, as well as additional power modes between power on and power off. System 100 includes P-channel transistors 102, 104, 106, 108, N-channel transistor 110, and comparators 112, 114. Source terminals of P-channel transistors 102, 104, 106 are coupled to supply voltage VDD. Drain terminals of P-channel transistors 102, 104, 106 are coupled to a controlled power supply VDDi. The controlled power supply VDDi is output to circuitry external to system 100, although the circuitry may be implemented on the same system on a chip (SOC) as system 100.

Gate terminals of P-channel transistors 102 and 108, and N-channel transistor 110 are coupled to a Power_b signal. A drain terminal of P-channel transistor 102 is coupled to a source terminal of P-channel transistor 108. A drain terminal of N-channel transistor 110 is coupled to a drain terminal of P-channel transistor 108. A source terminal of N-channel transistor 110 is coupled to ground. The terms "ground" and "VSS" as used herein refer to a voltage level of 0 Volts or a virtual ground signal that is lower than a supply voltage (such as VDD).

The drain terminal of P-channel transistor 108 is coupled to negative terminals of comparators 112, 114. A first reference voltage REF1 is input to a positive terminal of comparator 112. A second reference voltage REF2 is input to a positive terminal of comparator 114.

The output of comparator 112 is coupled to a gate terminal of P-channel transistor 104. The output of comparator 114 is coupled to a gate terminal of P-channel transistor 106. Note that one or more buffers can be included between the output comparators 112, 114 and respective P-channel transistors 104, 106 to provide a sufficient signal level at the gate terminals of P-channel transistors 104, 106.

The sizes of P-channel transistors 102, 104, 106 are selected so that when the current conducted by each transistor is added together, the current flowing to the circuitry attached to system 100 minimizes current-resistance (IR) drop between VDD and VDDi. To reduce transients to the circuitry, each transistor 102, 104, 106 contributes a portion of the current required to provide full power supply voltage VDD. For example, transistors 102, 104 can have the same size, each being approximately one-half the size of transistor 106.

The Power_b signal transitions low when supply power to the circuitry is shifting to a higher voltage, such as from an ultra-low power mode to a full power-on mode. When the Power_b signal is low, P-channel transistor 102 is conducting a portion of the current required to provide full supply voltage VDD. A portion of supply voltage VDD is thus supplied to the negative terminal of comparator 112. The value of reference voltage REF1 at the positive terminal of comparator 112 has a value that is lower than supply voltage VDD, for example, one-half of the value of VDD. Comparator 112 outputs a high signal until the negative input to comparator 112 exceeds reference voltage REF1, at which point the output of comparator 112 transitions low.

When the output of comparator 112 goes low, the input to the gate terminal of P-channel transistor 104 is low, so P-channel transistor 104 begins conducting another portion of the current required to achieve full supply voltage. The voltage at the drains of P-channel transistors 102, 104 and 108 is proportional to the current conducted through P-channel transistors 102 and 104.

The value of reference voltage REF2 at the positive terminal of comparator 114 has a value that is lower than supply voltage VDD and greater than the value of reference voltage REF1. For example, the value of reference voltage REF2 can be three-fourths of the value of VDD. Comparator 114 outputs a high signal until the negative input to comparator 114 is greater than reference voltage REF2, at which point, the output of comparator 114 goes low.

When the output of comparator 114 goes low, the input to the gate terminal of P-channel transistor 106 is low, so P-channel transistor 106 begins conducting another portion of the current required to achieve full supply voltage. The voltage VDDi at the drains of P-channel transistors 102, 104 and 108 is proportional to the current conducted through P-channel transistors 102, 104 and 106, which is full supply voltage VDD.

Figure 2:
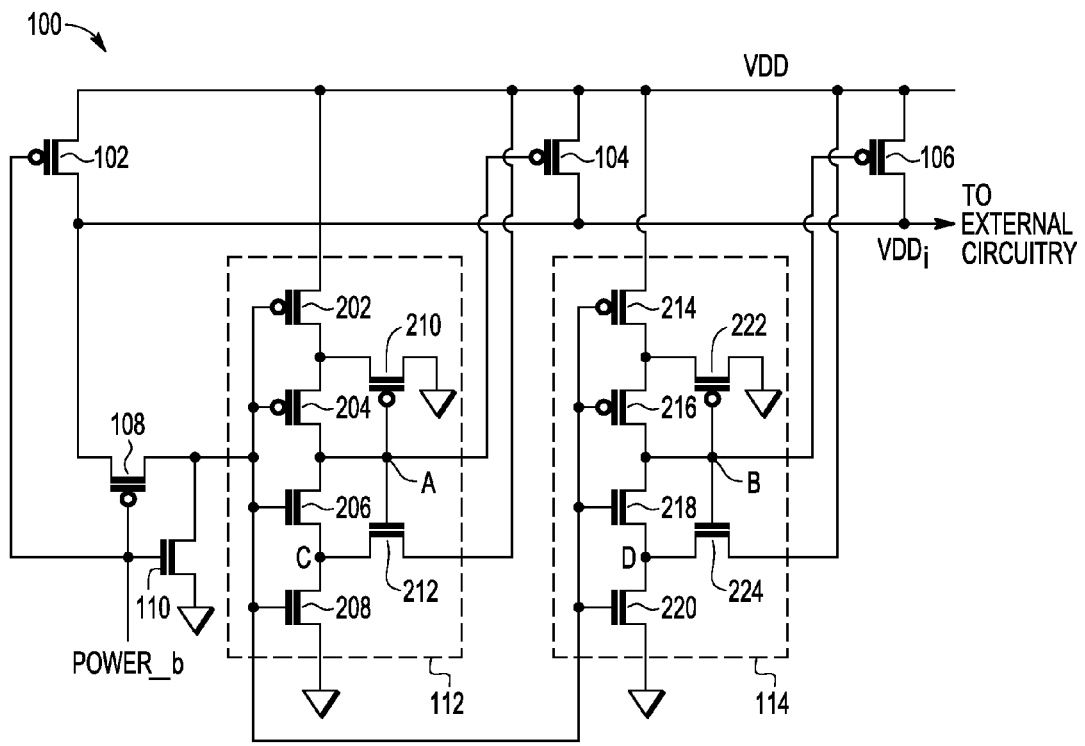
FIG. 2 is a more detailed block diagram of an embodiment of a system for controlling power.

FIG. 2 is a more detailed block diagram of an embodiment of system 100 for controlling power with comparators 112, 114 implemented using Schmitt triggers. In the example shown, comparator 112 includes P-channel transistors 202, 204 and 210 and N-channel transistors 206, 208 and 212. Gate terminals of transistors 202, 204, 206 and 208 are coupled to the drain terminal of P-channel transistor 108.

A source terminal of P-channel transistor 202 is coupled to supply voltage VDD. A drain terminal of P-channel transistor 202 is coupled to source terminals of P-channel transistors 204 and 210. A drain terminal of P-channel transistor 210 is coupled to ground. A drain terminal of P-channel transistor 204 is coupled to a drain terminal of N-channel transistor 206. The drain terminals of P-channel transistor 204 and N-channel transistor 206 are coupled to gate terminals of P-channel transistor 210, N-channel transistor 212 and P-channel transistor 104.

A source terminal of N-channel transistor 212 is coupled between the drain terminal of N-channel transistor 208 and the source terminal of N-channel transistor 206. A drain terminal of N-channel transistor 212 is coupled to supply voltage VDD.

Comparator 114 includes P-channel transistors 214, 216 and 222 and N-channel transistors 218, 220 and 224. Gate terminals of transistors 214, 216, 218 and 220 are coupled to the drain terminal of P-channel transistor 108 and to the gate terminals of transistors 202, 204, 206, 208.

A source terminal of P-channel transistor 214 is coupled to supply voltage VDD. A drain terminal of P-channel transistor 214 is coupled to source terminals of P-channel transistors 216 and 222. A drain terminal of P-channel transistor 222 is coupled to ground. A drain terminal of P-channel transistor 216 is coupled to a drain terminal of N-channel transistor 218. The drain terminals of P-channel transistor 216 and N-channel transistor 218 are coupled to gate terminals of P-channel transistor 222, N-channel transistor 224 and P-channel transistor 106.

A source terminal of N-channel transistor 224 is coupled between the drain terminal of N-channel transistor 220 and the source terminal of N-channel transistor 218. A drain terminal of N-channel transistor 224 is coupled to supply voltage VDD.

Transistors 202, 204, 206, 208, and transistors 214, 216, 218, 220 form respective inverters which output a high signal when a low signal is input and vice versa. Transistors 202, 204 and 214, 216 conduct when the input is low. N-channel transistors 212 and 224 introduce hysteresis in comparators 112, 114 by pulling respective nodes C and D to a higher potential (VDD minus VTN or threshold voltage of the N-channel transistors 212, 224) when respective P-channel transistors 202/204 and 214/216 are conducting. The presence of N-channel transistors 212 and 224 force a higher potential at the gates of respective transistors 206/208 and 218/220. P-channel transistors 210, 222 perform a similar hysteresis function for respective P-channel transistors 202/204 and 214/216 when input to comparators 112, 114 transitions from high to low.

When sufficient potential is available for N-channel transistors 206/208 to start conducting, the output of comparator 112 switches from high to low, causing P-channel transistor 104 to start conducting and increasing voltage VDDi closer to the value of supply voltage VDD.

As the potential at the gate terminals of N-channel transistors 218, 220 becomes sufficient to meet threshold requirements of N-channel transistors 218, 220, the output of comparator 114 switches from high to low, causing P-channel transistor 106 to start conducting and bringing voltage VDDi close or equal to the supply voltage VDD.

In some embodiments, the size of transistors in comparator 114 is greater than the size of transistors in comparator 112 t so that the output of comparator 112 switches from high to low before the output of comparator 114. In other embodiments, comparator 112 does not include transistor 212, which will also cause the output comparator 112 to switch from high to low before the output of comparator 114.

Figure 3:
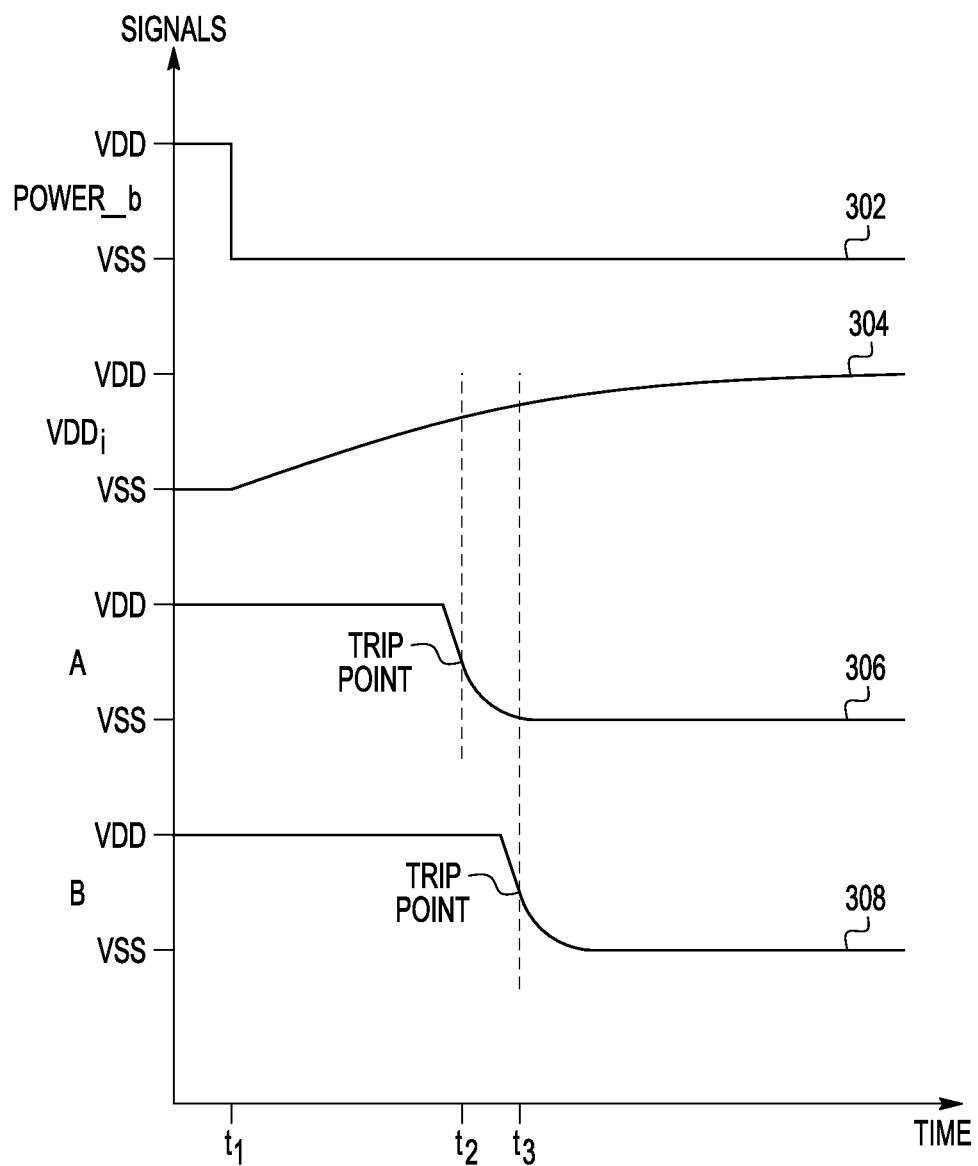
FIG. 3 shows examples of time history diagrams of various signals in the system of FIG. 2.

FIG. 3 shows examples of time history diagrams 302-308 of various signals in the system 100 of FIG. 2. Diagram 302 shows a step function for the Power_b signal starting at supply voltage VDD and transitioning to ground at time t1. When the Power_b signal is low, voltage VDDi starts to increase from VSS to VDD, as shown in diagram 304.

The voltages at nodes A and B start at voltage VDD. As voltage VDDi increases and reaches a trip point of comparator 112 at time t2, the voltage at node A starts decaying from supply voltage VDD to ground, as shown in diagram 306. As voltage VDDi further increases and reaches a trip point of comparator 114 at time t3, the voltage at node B starts decaying from supply voltage VDD to ground, as shown in diagram 308.

By now it should be appreciated that in some embodiments, there has been provided a power control circuit comprising a power supply node (VDD), a gated voltage supply node (VDDi), a plurality of transistors 102, 104, 106 coupled between the power supply node and the gated power supply node, each having a control electrode, a first current electrode coupled to the power supply node, and a second current electrode coupled to the gated voltage supply node. The gate electrode of a first transistor of the plurality of transistors is coupled to receive a power control signal, wherein, in response to assertion of the power control signal, the first transistor is placed into a conductive state. A first voltage comparator 112 has a first input and a first output coupled to the control gate of a second transistor of the plurality of transistors. In response to assertion of the power control signal, the first input is coupled to the gated voltage supply node and the first output places the second transistor in a conductive state when a voltage on the gated voltage supply node reaches a first reference voltage. A second voltage comparator 114 having a second input and a second output coupled to the control gate of a third transistor of the plurality of transistors. In response to assertion of the power control signal, the second input is coupled to the gated voltage supply node and the second output places the third transistor in a conductive state when the voltage on the gated voltage supply node reaches a second reference voltage that is different from the first reference voltage.

In another aspect, the power control circuit can further comprise a switch 108 having a first terminal coupled to the gated voltage supply node, a second terminal coupled to the first input and the second input, and a control terminal coupled to receive the power control signal. In response to assertion of the power control signal, the switch couples the first input to the gated voltage supply node and the second input to the gated voltage supply node.

In another aspect, the first reference voltage can be internal to the first voltage comparator and the second reference voltage is internal to the second voltage comparator.

In another aspect, at least two transistors of the plurality of transistors can be different sizes.

In another aspect, the second reference voltage can be greater than the first reference voltage.

In another aspect, the first voltage comparator can comprise a fourth transistor 204 having a control electrode coupled to the first input, a first current electrode, and a second current electrode coupled to the first output; and a fifth transistor 206 having a control electrode coupled to the first input, a first current electrode coupled to the first output, and a second current electrode. The second voltage comparator can comprise a sixth transistor 216 having a control electrode coupled to the second input, a first current electrode, and a second current electrode coupled to the second output; and a seventh transistor 218 having a control electrode coupled to the second input, a first current electrode coupled to the second output, and a second current electrode.

In another aspect, a ratio of sizes between the fourth and fifth transistor can determine the first reference voltage, and a ratio of sizes between the sixth and seventh transistor can determine the second reference voltage.

In another aspect, the first voltage comparator can comprise an eighth transistor 210 having a first current electrode coupled to the first current electrode of the fourth transistor, a control electrode coupled to the first output, and a second current electrode coupled to ground. The second voltage comparator can comprise a ninth transistor 222 having a first current electrode coupled to the first current electrode of the sixth transistor, a control electrode coupled to the second output, and a second current electrode coupled to ground. A tenth transistor 224 can have a first current electrode coupled to the second current electrode of the seventh transistor, a control electrode coupled to the second output, and a second current electrode coupled to the power supply node.

In another aspect, the sixth transistor can have a same size as the fourth transistor, and the seventh transistor has a same size as the fifth transistor.

In another aspect, the first voltage comparator can comprise an eleventh transistor 212 having a first current electrode coupled to the second current electrode of the fifth transistor, a control electrode coupled to the first output, and a second current electrode coupled to the power supply node.

In another aspect, the fourth and fifth transistors can be coupled between the power supply node and ground, and the sixth and seventh transistors can be coupled between the power supply node and ground.

In other embodiments, methods of powering up a gated voltage supply node can comprise in response to commencing power up the gated voltage supply node, placing a first transistor 102 coupled between the gated voltage supply node and a power supply node in a conductive state; and detecting when a voltage of the gated voltage supply node reaches a first reference voltage and a second reference voltage. The second reference voltage is greater than the first reference voltage. When the voltage of the gated voltage supply node reaches the first reference voltage, a second transistor 104 coupled between the gated voltage supply node and the power supply node is placed in a conductive state. When the voltage of the gated voltage supply node reaches the second reference voltage, a third transistor (106) coupled between the gated voltage supply node and the power supply node is placed in a conductive state.

In another aspect, the third transistor can be bigger than at least one of the first or the second transistor.

In another aspect, the detecting when a voltage of the gated voltage supply node reaches a first reference voltage can be performed by a first voltage detector 112 and the detecting when a voltage of the gated voltage supply node reaches a second reference voltage can be performed by a second voltage detector 114. The first voltage detector can comprise a first inverter having a first trip point corresponding to the first reference voltage, and the second voltage detector comprises a second inverter having a second trip point corresponding to the second reference voltage.

In another aspect, each of the first and second voltage detectors can be further characterized as a Schmitt trigger.

In still other embodiments, a power control circuit can comprise a first transistor 102 can have a first current electrode coupled to a power supply node, a control electrode coupled to receive a power up control signal, and a second current electrode coupled to a gated voltage supply voltage node. A second transistor 104 can have a first current electrode coupled to the power supply node, a control electrode, and a second current electrode coupled to the gated voltage supply node. A third transistor 106 can have a first current electrode coupled to the power supply node, a control electrode, and a second current electrode coupled to the gated voltage supply node. A switch 108 can have a first terminal coupled to the gated voltage supply node, a second terminal, and a control terminal coupled to receive the power up control signal. A first inverter 112 can be coupled between the second terminal of the switch and the control gate of the second transistor. The first inversion circuit can have a first trip point. A second inverter 114 can be coupled between the second terminal of the switch and the control gate of the third transistor. The second inversion circuit can have a second trip point greater than the first trip point.

In another aspect, the third transistors can be larger than at least one of the first transistor and the second transistor.

In another aspect, the first inverter can comprise a fourth transistor 204 having a first current electrode, a control electrode coupled to the second terminal of the switch, and a second current electrode coupled to the control electrode of the second transistor. A fifth transistor 206 can have a first current electrode coupled to the second current electrode of the fourth transistor and the control electrode of the second transistor, a control electrode coupled to the second terminal of the switch, and a second current terminal. The fourth and fifth transistors can be coupled between the power supply node and a ground node. The second inverter can comprise a sixth transistor 216 having a first current electrode, a control electrode coupled to the second terminal of the switch, and a second current electrode coupled to the control electrode of the third transistor. A seventh transistor 218 can have a first current electrode coupled to the second current electrode of the sixth transistor and the control node of the third transistor, a control electrode coupled to the second terminal of the switch, and a second current terminal. The sixth and seventh transistors can be coupled between the power supply node and the ground node.

In another aspect, an eighth transistor 210 can have a first current electrode coupled to the first current electrode of the fourth transistor, a control electrode coupled to the control electrode of the second transistor, and a second current electrode coupled to the ground node. A ninth transistor 222 can have a first current electrode coupled to the first current electrode of the sixth transistor, a control electrode coupled to the control electrode of the third transistor, and a second current electrode coupled to the ground node. A tenth transistor 224 can have a first current electrode coupled to the second current electrode of the seventh transistor, a control electrode coupled to the control electrode of the third transistor, and a second current electrode coupled to the power supply node.

In another aspect, an eleventh transistor 212 can have a first current electrode coupled to the second current electrode of the fifth transistor, a control electrode coupled to the control electrode of the second transistor, and a second current electrode coupled to the power supply node.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIGS. 1 and 2 and the discussion thereof describe an exemplary architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A power control circuit comprising:
a power supply node;
a gated voltage supply node;
a plurality of transistors coupled between the power supply node and the gated voltage supply node, each having a control electrode, a first current electrode coupled to the power supply node, and a second current electrode coupled to the gated voltage supply node, wherein the gate electrode of a first transistor of the plurality of transistors is coupled to receive a power control signal, wherein, in response to assertion of the power control signal, the first transistor is placed into a conductive state;
a first voltage comparator having a first input and having a first output coupled to the control gate of a second transistor of the plurality of transistors, wherein, in response to assertion of the power control signal, the first input is coupled to the gated voltage supply node and the first output places the second transistor in a conductive state when a voltage on the gated voltage supply node reaches a first reference voltage; and
a second voltage comparator having a second input and having a second output coupled to the control gate of a third transistor of the plurality of transistors, wherein, in response to assertion of the power control signal, the second input is coupled to the gated voltage supply node and the second output places the third transistor in a conductive state when the voltage on the gated voltage supply node reaches a second reference voltage that is different from the first reference voltage; and
a single a switch having a first terminal coupled to the gated voltage supply node, a second terminal coupled to the first input and the second input, and a control terminal coupled to receive the power control signal, wherein, in response to assertion of the power control signal, the switch couples the first input to the gated voltage supply node and the second input to the gated voltage supply node.

2. The power control circuitry of claim 1, wherein the first reference voltage is internal to the first voltage comparator and the second reference voltage is internal to the second voltage comparator.

3. The power control circuitry of claim 1, wherein at least two transistors of the plurality of transistors are different sizes.

4. The power control circuitry of claim 1, wherein the second reference voltage is greater than the first reference voltage.

5. The power control circuitry of claim 1, wherein:
the first voltage comparator comprises:
a fourth transistor having a control electrode coupled to the first input, a first current electrode, and a second current electrode coupled to the first output; and
a fifth transistor having a control electrode coupled to the first input, a first current electrode coupled to the first output, and a second current electrode; and
the second voltage comparator comprises:
a sixth transistor having a control electrode coupled to the second input, a first current electrode, and a second current electrode coupled to the second output; and
a seventh transistor having a control electrode coupled to the second input, a first current electrode coupled to the second output, and a second current electrode.

6. The power control circuitry of claim 5, wherein a ratio of sizes between the fourth and fifth transistor determine the first reference voltage, and a ratio of sizes between the sixth and seventh transistor determine the second reference voltage.

7. The power control circuitry of claim 5, wherein:
the first voltage comparator comprises:
an eighth transistor having a first current electrode coupled to the first current electrode of the fourth transistor, a control electrode coupled to the first output, and a second current electrode coupled to ground;
the second voltage comparator comprises:
a ninth transistor having a first current electrode coupled to the first current electrode of the sixth transistor, a control electrode coupled to the second output, and a second current electrode coupled to ground; and
a tenth transistor having a first current electrode coupled to the second current electrode of the seventh transistor, a control electrode coupled to the second output, and a second current electrode coupled to the power supply node.

8. The power control circuitry of claim 7, wherein the sixth transistor has a same size as the fourth transistor, and the seventh transistor has a same size as the fifth transistor.

9. The power control circuitry of claim 7, wherein the first voltage comparator comprises an eleventh transistor having a first current electrode coupled to the second current electrode of the fifth transistor, a control electrode coupled to the first output, and a second current electrode coupled to the power supply node.

10. The power control circuitry of claim 5, wherein the fourth and fifth transistors are coupled between the power supply node and ground, and the sixth and seventh transistors are coupled between the power supply node and ground.

11. A method of powering up a gated voltage supply node, comprising:
in response to commencing power up the gated voltage supply node, placing a first transistor coupled between the gated voltage supply node and a power supply node in a conductive state, and operating a single switch to couple a first input of a first comparator and a second input of a second comparator to the gated voltage supply node;
detecting when a voltage of the gated voltage supply node reaches a first reference voltage and a second reference voltage, wherein the second reference voltage is greater than the first reference voltage;
when the voltage of the gated voltage supply node reaches the first reference voltage, placing a second transistor coupled between the gated voltage supply node and the power supply node in a conductive state; and
when the voltage of the gated voltage supply node reaches the second reference voltage, placing a third transistor coupled between the gated voltage supply node and the power supply node in a conductive state.

12. The method of claim 11, wherein the third transistor is bigger than at least one of the first or the second transistor.

13. The method of claim 11, wherein the detecting when a voltage of the gated voltage supply node reaches a first reference voltage is performed by a first voltage detector and the detecting when a voltage of the gated voltage supply node reaches a second reference voltage is performed by a second voltage detector, wherein the first voltage detector comprises a first inverter having a first trip point corresponding to the first reference voltage, and the second voltage detector comprises a second inverter having a second trip point corresponding to the second reference voltage.

14. The method of claim 13, wherein each of the first and second voltage detectors is further characterized as a Schmitt trigger.

15. A power control circuit, comprising:
a first transistor having a first current electrode coupled to a power supply node, a control electrode coupled to receive a power up control signal, and a second current electrode coupled to a gated voltage supply voltage node;
a second transistor having a first current electrode coupled to the power supply node, a control electrode, and a second current electrode coupled to the gated voltage supply node;
a third transistor having a first current electrode coupled to the power supply node, a control electrode, and a second current electrode coupled to the gated voltage supply node;
a switch having a first terminal coupled to the gated voltage supply node, a second terminal, and a control terminal coupled to receive the power up control signal;
a first inverter coupled between the second terminal of the switch and the control gate of the second transistor, wherein the first inversion circuit has a first trip point; and
a second inverter coupled between the second terminal of the switch and the control gate of the third transistor, wherein the second inversion circuit has a second trip point greater than the first trip point wherein, in response to assertion of the power up control signal, the second terminal of the switch couples a first input of the first inverter to the gated voltage supply node and a second input of the second inverter to the gated voltage supply node.

16. The power control circuitry of claim 15, wherein the third transistors is larger than at least one of the first transistor and the second transistor.

17. The power control circuitry of claim 15, wherein:
the first inverter comprises:
a fourth transistor having a first current electrode, a control electrode coupled to the second terminal of the switch, and a second current electrode coupled to the control electrode of the second transistor;
a fifth transistor having a first current electrode coupled to the second current electrode of the fourth transistor and the control electrode of the second transistor, a control electrode coupled to the second terminal of the switch, and a second current terminal, wherein the fourth and fifth transistors are coupled between the power supply node and a ground node; and the second inverter comprises:
- a sixth transistor having a first current electrode, a control electrode coupled to the second terminal of the switch, and a second current electrode coupled to the control electrode of the third transistor; and
- a seventh transistor having a first current electrode coupled to the second current electrode of the sixth transistor and the control node of the third transistor, a control electrode coupled to the second terminal of the switch, and a second current terminal, wherein the sixth and seventh transistors are coupled between the power supply node and the ground node.

18. The power circuit of claim 17, further comprising:
an eighth transistor having a first current electrode coupled to the first current electrode of the fourth transistor, a control electrode coupled to the control electrode of the second transistor, and a second current electrode coupled to the ground node;
a ninth transistor having a first current electrode coupled to the first current electrode of the sixth transistor, a control electrode coupled to the control electrode of the third transistor, and a second current electrode coupled to the ground node; and
a tenth transistor having a first current electrode coupled to the second current electrode of the seventh transistor, a control electrode coupled to the control electrode of the third transistor, and a second current electrode coupled to the power supply node.

19. The power circuit of claim 18, further comprising:
an eleventh transistor having a first current electrode coupled to the second current electrode of the fifth transistor, a control electrode coupled to the control electrode of the second transistor, and a second current electrode coupled to the power supply node.

* * * * *